United States Patent [19]
Krett

[11] Patent Number: 5,420,464
[45] Date of Patent: May 30, 1995

[54] RF VOLTAGE/CURRENT SENSOR APPARATUS

[75] Inventor: David L. Krett, Springville, Iowa

[73] Assignee: Rockwell International Corp., Seal Beach, Calif.

[21] Appl. No.: 68,739

[22] Filed: Oct. 30, 1992

[51] Int. Cl.⁶ .............................. H03H 11/24
[52] U.S. Cl. ........................ 307/98; 331/66; 331/96; 330/277; 330/286; 327/50
[58] Field of Search .............. 330/277, 286, 302, 306, 330/311, 307, 53, 56; 324/72.5, 149; 331/66, 96, 99, 117 D, 36 C, 117 FE, 117 V, 101, 102; 307/248, 570–573, 581–585, 497, 296.3, 296.4, 296.5, 98–100, 112–116; 333/109, 24 R, 24 C, 116

[56] References Cited

U.S. PATENT DOCUMENTS 4,749,959  6/1988  Cripps et al. ................... 330/277
5,309,048  5/1994  Khabbaz ........................ 307/542

Primary Examiner—Steven L. Stephan
Assistant Examiner—Aditya Krishnan
Attorney, Agent, or Firm—Kyle Eppele; M. Lee Murrah; H. Fredrick Hamann

[57] ABSTRACT

An RF voltage/current sensor apparatus comprising a plurality of transmission lines coupled through resistive means to voltage sense circuitry. The voltage sense circuitry utilizes transistor technology thereby reducing the use of switching relays, transformers and diodes thereby providing an apparatus operational over a frequency range from approximately two megahertz to two gigahertz.

14 Claims, 3 Drawing Sheets

RF VOLTAGE/CURRENT SENSOR APPARATUS

BACKGROUND OF THE INVENTION

This invention relates to RF voltage/current sensor apparatus and more particularly to broad-band RF voltage/current sensor apparatus or directional couplers.

An RF voltage/current sensor apparatus is a device which samples a small portion of the energy of a wave signal which is traveling through a transmission line. The sensor apparatus may be thought as comprised of a first circuit to sample the voltage on the transmission line and a second circuit to sample the current on the transmission line. These samples provide two voltages which are then used to add for current in one direction and subtract for current in the opposite direction.

Prior art voltage/current sensor apparatus or directional coupler designs were often comprised of a either a capacitive-resistance voltage divider and a loop current probe or capacitive voltage dividers with inserted resistance in the main transmission line. Modifications of these designs eliminated the resistance inserted directly into the transmission line while replacing it with resistance coupled to the transmission line through mutual inductance. While these types of sensors have proven satisfactory they generally are limited to a fairly narrow frequency range.

There exists a need for an improved RF voltage/current sensor apparatus that is less bandwidth limited by its components operational parameters than those known in the prior art.

SUMMARY OF THE INVENTION

The present invention comprises an RF voltage/current sensor capable of operating over a very wide frequency range while also serving as a port for various other monitoring circuitry. A plurality of transmission lines having an active voltage sense circuit coupled thereto and comprised of commercially available resistors, capacitors and transistor components, thereby reducing the inherent limitations of prior art RF voltage/current sensor apparatus designs. The utilization of transistor technology provides access for connection of additional electrical monitoring circuitry such as wattmeter means or discriminator means.

It is an object of the present invention to provide an RF voltage/current sensor apparatus having operating parameters over a very wide frequency range.

It is a further object of the present invention to provide an RF voltage/current sensor apparatus which may also serve as an integral coupling for various electrical monitoring circuits.

It is a feature of the present invention to reduce the reliance upon switching relays, diodes and associated components as known in prior art RF voltage/current sensor apparatus.

It is an additional feature of the present invention to utilize transistor technology in the sensing circuitry.

It is an advantage of the present invention that accurate and efficient RF signal voltage/current sensing is provided with well known components having operating parameters in the frequency range of two megahertz to two gigahertz.

It is an additional advantage of the present invention that the sensing circuitry of the present invention may serve as a port for various other monitoring circuitry.

These and other objects, features and advantages are disclosed and claimed in the specification, figures and claims of the present application.

DETAILED DESCRIPTION OF THE FIGURES

Figure 1:
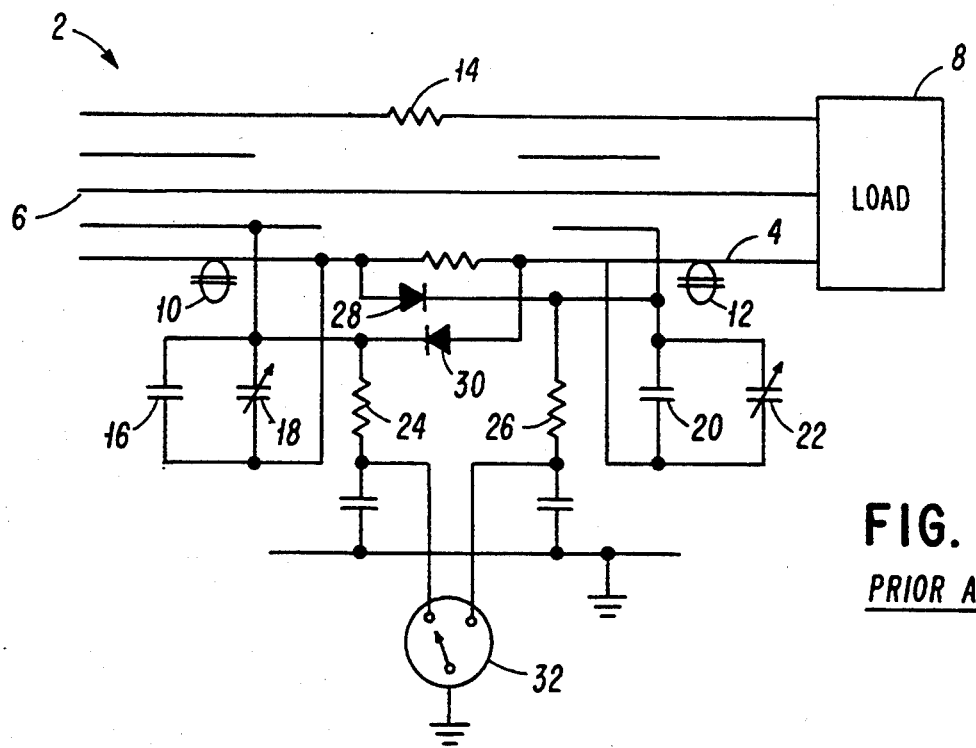
FIG. 1 is a schematic drawing illustrating the electrical circuit configuration of an RF voltage/current sensor apparatus as known in the prior art.

Referring now to the Figures where like items are referenced as such throughout, FIG. 1 shows a broadband directional coupler as known in the prior art and used in a reflectometer device. A coaxial cable 2 having an outer conductor 4 and a center conductor 6 is depicted coupled to load means 8. A pair of matched torodial ferro-electric cores 10 and 12 are coupled to the outer surface of the outer conductor 4 on either side of resistive means 14. Matched networks of capacitors 16, 18, 20, 22, resistors 24, 26, and diodes 28 and 30 serve to couple the outer and inner conductors, 4 and 6, respectively, of coaxial cable 2 to attached metering means 32.

The above described coupling arrangement is based upon the well known theory of the existence of a current, on the inner surface of the outer conductor of a coaxial transmission line which is equal and opposite to the current flowing in the center conductor. The series combination of capacitance and parallel capacitance represent an adjustable voltage divider which transfers a signal proportional to the incident signal appearing across coaxial conductors. By adjusting capacitances the signals may be monitored with suitable calibrated metering means.

Diodes 28 and 30 are critical components of the above described configuration and create inherent limitations in the available bandwidth that can be successfully accommodated.

Figure 2:
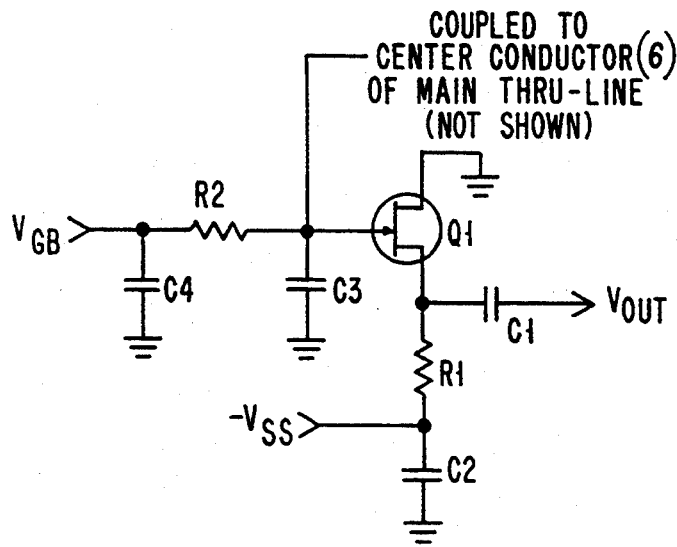
FIG. 2 is a schematic drawing illustrating the electrical circuit configuration of the present invention.

FIG. 2 is a schematic electrical diagram of the teachings of the present invention. A transistor $Q_1$ is a key component of the circuit and is configured as described below. Transistor $Q_1$ has its drain electrode grounded and its source electrode coupled to capacitor $C_1$ and in parallel through resistor $R_1$ and then to a voltage source $V_{SS}$ and grounded capacitor $C_2$. The gate electrode of transistor $Q_1$ is coupled in parallel to the center conductor of a main through line of an RF signal carrier (not shown), grounded capacitor $C_3$ and resistor $R_2$ which in turn is coupled to a voltage source $V_{GB}$ and a grounded capacitor $C_4$.

Capacitors $C_2$ and $C_4$ provide RF signal bypass in the circuit depicted in FIG. 2, while capacitor $C_1$ serves as a DC voltage blocker. Voltage source $V_{GB}$ provides a biasing DC current coupled to the gate electrode of transistor $Q_1$. Voltage source $V_{SS}$ provides a DC current limited by $R_1$ and coupled to the source electrode of transistor $Q_1$. The output sample voltage, $V_{OUT}$ is provided via the non-source electrode end of capacitor $C_1$.

Figure 3:
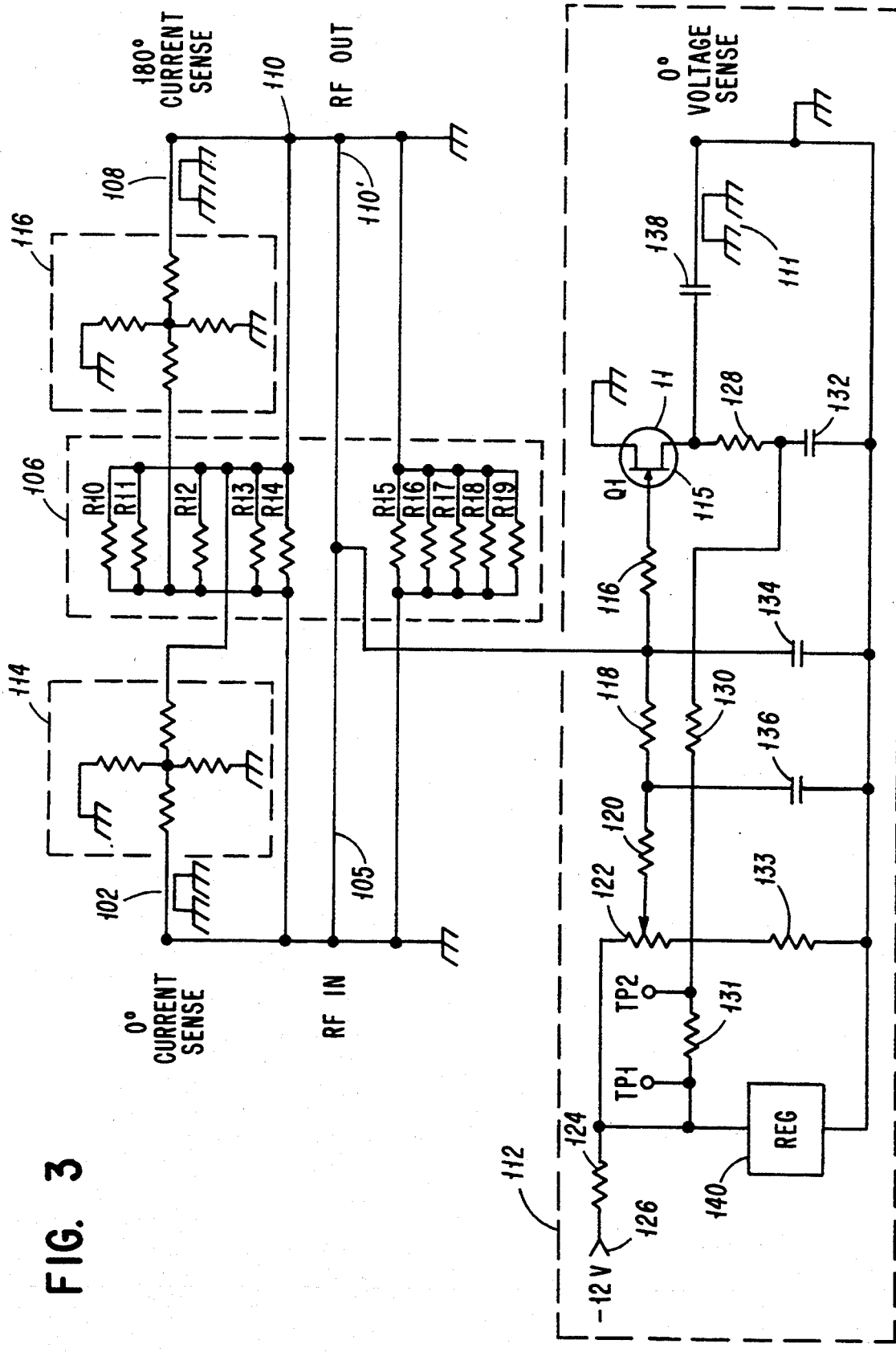
FIG. 3 is a schematic drawing illustrating an alternate embodiment of the electrical circuit configuration of the present invention.

FIG. 3 is a schematic electrical diagram of the teachings of the present invention incorporated into an alternate embodiment. A first microstrip 102 is coupled through resistive means 106 and in turn coupled to microstrip 108 and to ground planes 110 and 110', respectively. Although described in terms of microstrips it is understood that other transmission lines, such as coaxial cables may also be used with the teachings of the present invention. Voltage sample circuitry 112 is coupled to transmission line 105. Attenuation means 114 and 116 may also be incorporated into microstrip lines 102 and 108 on either side of resistive means 106.

Voltage sample circuitry 112, comprised of a plurality of resistors, capacitors and transistor means provides for measuring more than ten octave frequency bands. The depicted embodiment of the voltage sample circuitry is comprised of a gallium arsenide N-Channel junction gate Field Effect Transistor (FET) 115, commercially available from various major semiconductor manufacturers. Although a gallium arsenide FET is utilized it is understood that other devices such as bipolar silicon devices could also be used with the teaching of the present invention, although the resulting operating parameters would have less bandwidth capability than gallium arsenide products. Transistor 115 has its drain electrode grounded and its gate electrode serially coupled through resistors 116, 118, and 120. Resistor 120 is coupled through resistors 122 and 124 to a voltage source 126. The source electrode of transistor 115 is coupled through resistors 128, 130, 131, 124 and also to voltage source 126. Capacitor 132 has one terminal disposed between resistors 128 and 130 while its other terminal is coupled to a ground. Capacitor 134 is similarly configured between resistors 116, 118 and ground. Likewise capacitor 136 is configured between resistors 118, 120 and ground. An additional capacitor 138 is coupled between the source electrode of transistor 114 and microstrip 111. The ground plane of microstrip 111 serves as a common ground source for the previously mentioned capacitors and voltage regulator device 140 disposed between ground and resistors 124 and 131. Finally, ports TP$_1$ and TP$_2$ are coupled to either end of resistor 131 while transmission line 105 and ground plane 110 is coupled between resistors 116 and 118.

Exemplary values for specified components described above are provided in Table 1 below, assuming a load impedance of 50 ohms and an attenuator value of 15 decibels for each attenuator means.

TABLE 1

| Component Specifications | |
|---|---|
| Capacitor Value Pico-Farads (pF) | Resistor Value Ohms |
| $C_{132}$ = 10,000 | *$R_{106}$ = 10.20 |
| $C_{134}$ = 4.30 | **$R_{106}$ = 17.40 |
| $C_{136}$ = 10,000 | $R_{116}$ = 50.00 |
| $C_{138}$ = 100,000 | $R_{118}$ = 270,000 |
| | $R_{120}$ = 50.00 |
| | $R_{122}$ = 5,000 |
| | $R_{124}$ = 560.00 |
| | $R_{128}$ = 390.00 |
| | $R_{130}$ = 5.00 |
| | $R_{131}$ = 10.00 |
| | $R_{133}$ = 4.99 |

*For $R_{10}$, $R_{11}$, $R_{13}$-$R_{19}$
**For $R_{12}$

With a first end of transmission line 105 coupled to an RF power source and the other end of transmission line 105 coupled to a resistive load approximately equal to the characteristic impedance of transmission line 105, the current sense port, microstrip 102, will have no phase shift with respect to the RF input and the current sense port 108 will be 180 degrees out of phase with the input. Microstrips 102 and 108 may be routed through a toroid core (not shown) to form a balun directional coupler. Because resistive means 106 is in series with the ground planes of transmission line 105, a voltage is developed across resistive means 106 which is proportional to the current through it.

Figure 5:
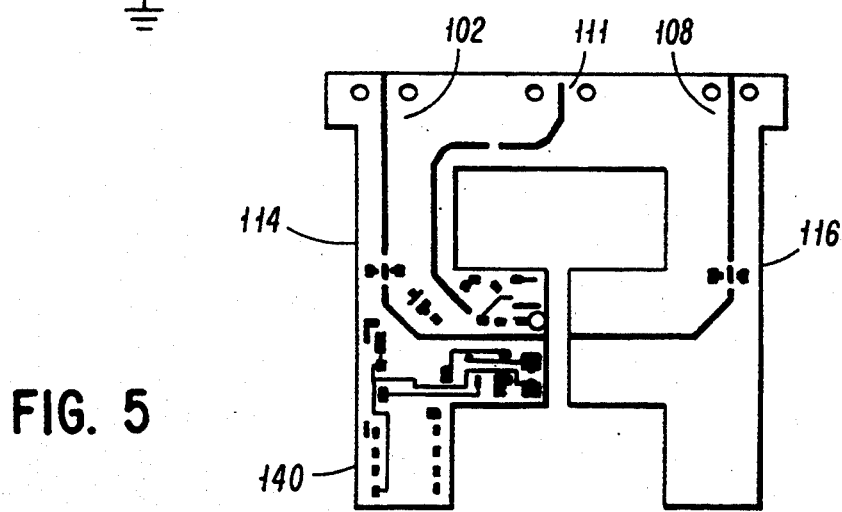
FIG. 5 is top plan view of one embodiment of the present invention.
Figure 4:
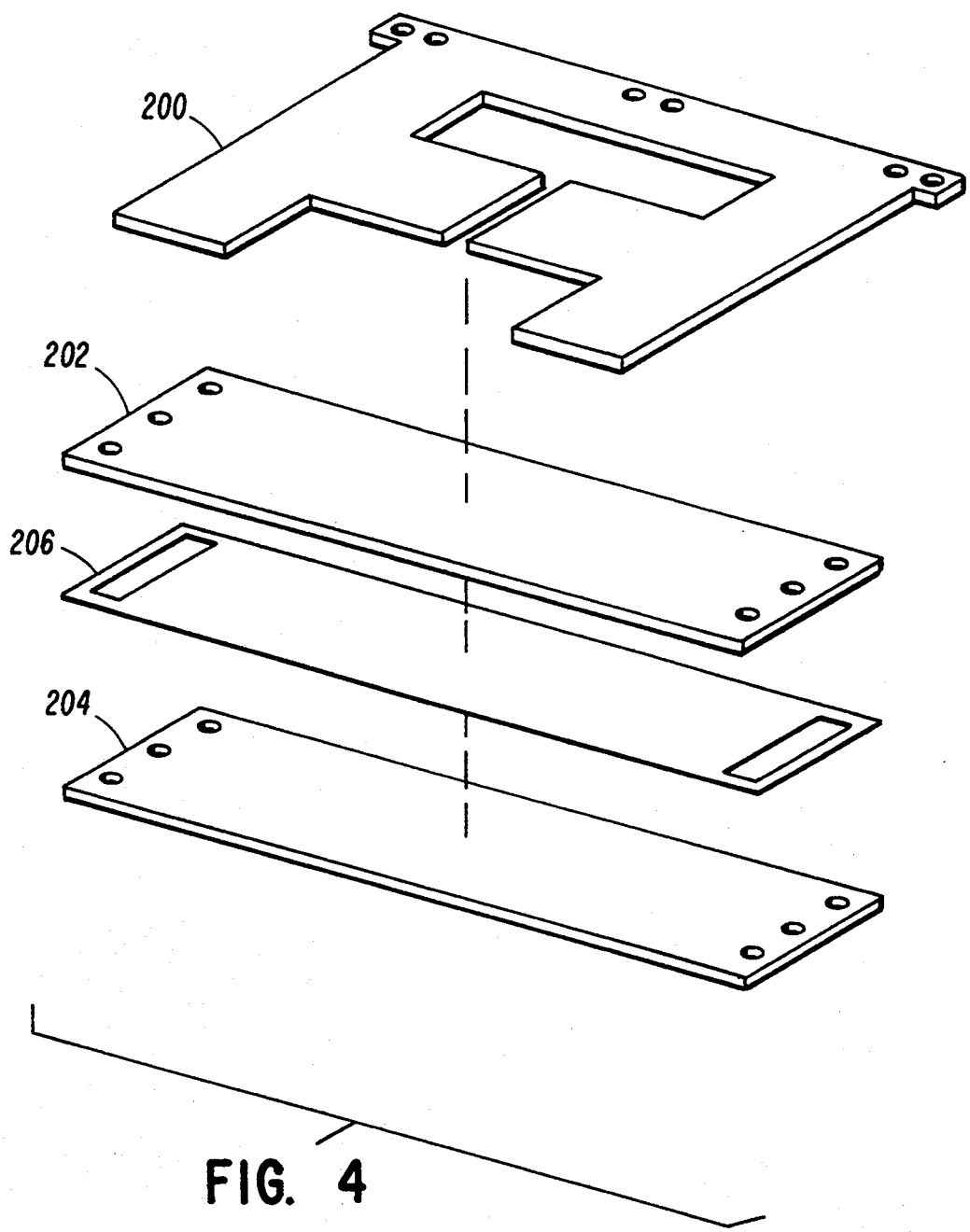
FIG. 4 is an exploded orthogonal view of one embodiment of the present invention.

FIG. 4 illustrates an exploded orthogonal view of the embodiment disclosed in FIG. 3, while FIG. 5 illustrates a top plan view of the same embodiment. The stripline conductors 102, 108 and 111 are readily identifiable. The entire assembly comprised of substrate 200, ground planes 202 and 204, and center conductor 206, respectively is manufactured in accordance with well known fabrication and assembly techniques for such components with the individual components held in place with a variety of means including conductive epoxies and soldering. Substrate 200 is of any ceramic composition, while ground plane 202 and 204 is any suitable metal such as copper or beryillium as is suspended stripline transmission line 206, with air serving as the dielectric material of suspended stripline 207.

It is thought that the methods of the present invention and many of its attendant advantages will be understood from the foregoing description, and it will be apparent that various changes may be made in the form, construction and arrangement of the parts and the steps thereof without departing from the spirit and scope of the invention, or sacrificing all their material advantages, the forms described herein being merely preferred embodiments thereof.

We claim:

1. An RF voltage/current sensor apparatus comprising:
a plurality of transmission lines with one transmission line comprising the primary signal carrier transmission line;
an active capacitive divider means coupled to the primary signal carrier transmission line; and
transistor means coupled to the capacitive divider means for making the impedance of the capacitive voltage divider means substantially independent of frequency.

2. The apparatus of claim 1 wherein the plurality of transmission lines is comprised of four coaxial cables.

3. The apparatus of claim 1 wherein the transistor is a gallium arsenide N-channel Field Effect Transistor.

4. The apparatus of claim 1 wherein the transistor is a bi-polar transistor.

5. The apparatus of claim 1 further comprising coupling ports within the active capacitive divider means for attaching monitoring circuitry.

6. The apparatus of claim 1 operating as a balun directional coupler means over the frequency range of two megahertz to two gigahertz.

7. An RF voltage/current sensor apparatus comprising:
a first and a second microstrip transmission line;
a plurality of ground planes;
resistive means coupled to the ground planes and at least one microstrip transmission lines; and
voltage sense circuitry coupled to the second microstrip transmission line;

wherein the voltage sense circuitry is comprised of transistor means for making the impedance of the current sense means independent of frequency.

8. The apparatus of claim 7 wherein the first microstrip transmission line is a suspended type coupler line.

9. The apparatus of claim 7 wherein the transistor is a gallium arsenide N-channel Field Effect Transistor.

10. The apparatus of claim 7 wherein the transistor is a bi-polar transistor.

11. The apparatus of claim 7 further comprising attenuation means on either side of resistive means of the second microstrip transmission line.

12. The apparatus of claim 7 wherein the resistive means is comprised of a plurality of discrete resistors coupled in parallel.

13. The apparatus of claim 7, further comprising coupling ports within the active capacitive divider means for attaching monitoring circuitry.

14. The apparatus of claim 7 operating as a balun directional coupler means over the frequency range of two megahertz to two gigahertz.

* * * * *